US011068313B2

United States Patent
Fontanari Filho et al.

(10) Patent No.: US 11,068,313 B2
(45) Date of Patent: Jul. 20, 2021

(54) CLOUD BROKERAGE APPLICATION DECOMPOSITION AND MIGRATION

(71) Applicant: International Business Machines Corporation, Armonk, NY (US)

(72) Inventors: Pedro Fontanari Filho, Sao Paulo (BR); Sergio Varga, Campinas (BR); Ronaldo Pires, Americana (BR); Thiago Rodrigues de Souza Costa, Belem (BR)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 16/269,659

(22) Filed: Feb. 7, 2019

(65) Prior Publication Data
US 2020/0257567 A1    Aug. 13, 2020

(51) Int. Cl.
| | | |
|---|---|---|
| *G06F 9/50* | (2006.01) | |
| *G06F 9/455* | (2018.01) | |
| *G06F 16/901* | (2019.01) | |
| *G06F 30/20* | (2020.01) | |

(52) U.S. Cl.
CPC ........ *G06F 9/5066* (2013.01); *G06F 9/45558* (2013.01); *G06F 16/901* (2019.01); *G06F 30/20* (2020.01); *G06F 2009/4557* (2013.01); *G06F 2009/45591* (2013.01)

(58) Field of Classification Search
CPC ........... G06F 16/901; G06F 2009/4557; G06F 2009/45591; G06F 30/20; G06F 9/45558; G06F 9/5066
See application file for complete search history.

(56) References Cited

U.S. PATENT DOCUMENTS

| | | | |
|---|---|---|---|
| 9,602,598 B2 | 3/2017 | Bhattacharya et al. | |
| 9,824,390 B2 | 11/2017 | Adapalli et al. | |
| 2012/0221454 A1 | 8/2012 | Morgan | |
| 2013/0138919 A1* | 5/2013 | Wang | ............... G06F 15/17362 712/29 |
| 2013/0198050 A1 | 8/2013 | Shroff et al. | |
| 2014/0201218 A1* | 7/2014 | Catalano | .................. G06F 8/60 707/748 |
| 2014/0278808 A1 | 9/2014 | Iyoob et al. | |
| 2014/0279201 A1 | 9/2014 | Iyoob et al. | |

(Continued)

OTHER PUBLICATIONS

"Decomposing applications for deployability and scalability", plain old objects, 2 pages, printed on Dec. 30, 2017, <plainoldobjects. com/presentations/decomposing-applications-for-deployability-and-scalability/>.

(Continued)

*Primary Examiner* — Jorge A Chu Joy-Davila
(74) *Attorney, Agent, or Firm* — David K. Mattheis; William H. Hartwell; Nicholas L. Cadmus

(57) ABSTRACT

Decomposing and migrating applications by receiving a candidate application, identifying components of the candidate application, analyzing the granularity of components, decomposing a component into sub-components; identifying cloud service provider offerings, mapping the cloud service provider offerings to a technology mapping database, collecting performance information on the cloud service provider offerings, estimating performance associated with deploying sub-components across cloud service provider offerings; and ranking the performance of different deployment scenarios.

17 Claims, 5 Drawing Sheets

(56) References Cited

U.S. PATENT DOCUMENTS

2014/0280848 A1    9/2014   Modh et al.
2016/0147522 A1    5/2016   Dimitrakos et al.
2018/0239648 A1*   8/2018   Formanek ........... G06F 9/45558

OTHER PUBLICATIONS

Bhattacharya et al., "Service Insurance: A New Approach in Cloud Brokerage", adfa, p. 1, 2001, 14 pages, © Springer-Verlag Berlin Heidelberg 2011, <itra.medialabasia.in/data/Documents/RemoteHealth/publications/Service%20Insurance%20A%20New%20Approach%20in%20Cloud%20Brokerag.pdf>.

Mell et al., "The NIST Definition of Cloud Computing", Recommendations of the National Institute of Standards and Technology, Special Publication 800-145, Sep. 2011, 7 pages.

* cited by examiner

CLOUD BROKERAGE APPLICATION DECOMPOSITION AND MIGRATION

BACKGROUND

The disclosure relates generally to managing application execution utilizing cloud computing resources. The disclosure relates particularly to optimizing cloud brokerage execution through application decomposition and migration of application components to particular cloud resource providers.

Business computer application users may utilize a Cloud Service Provider (CSP), or a Cloud Brokerage Service (CBS) to source the virtual machines (VM) necessary for operating the applications using cloud resources. The CSP and CBS may select and provide resources according to the computational and storage needs of the overall application. The user benefits by having a single source for their resources and avoiding the use of time and resources procuring cloud service resources.

SUMMARY

Aspects of the invention disclose methods, systems and computer readable media associated with receiving a candidate application, identifying components of the candidate application, analyzing the granularity of components, decomposing a component into sub-components; identifying cloud service provider offerings, mapping the cloud service provider offerings to a technology mapping database, collecting performance information on the cloud service provider offerings, estimating performance associated with deploying sub-components across cloud service provider offerings; and ranking the performance of different deployment scenarios.

DETAILED DESCRIPTION

Figure 1:
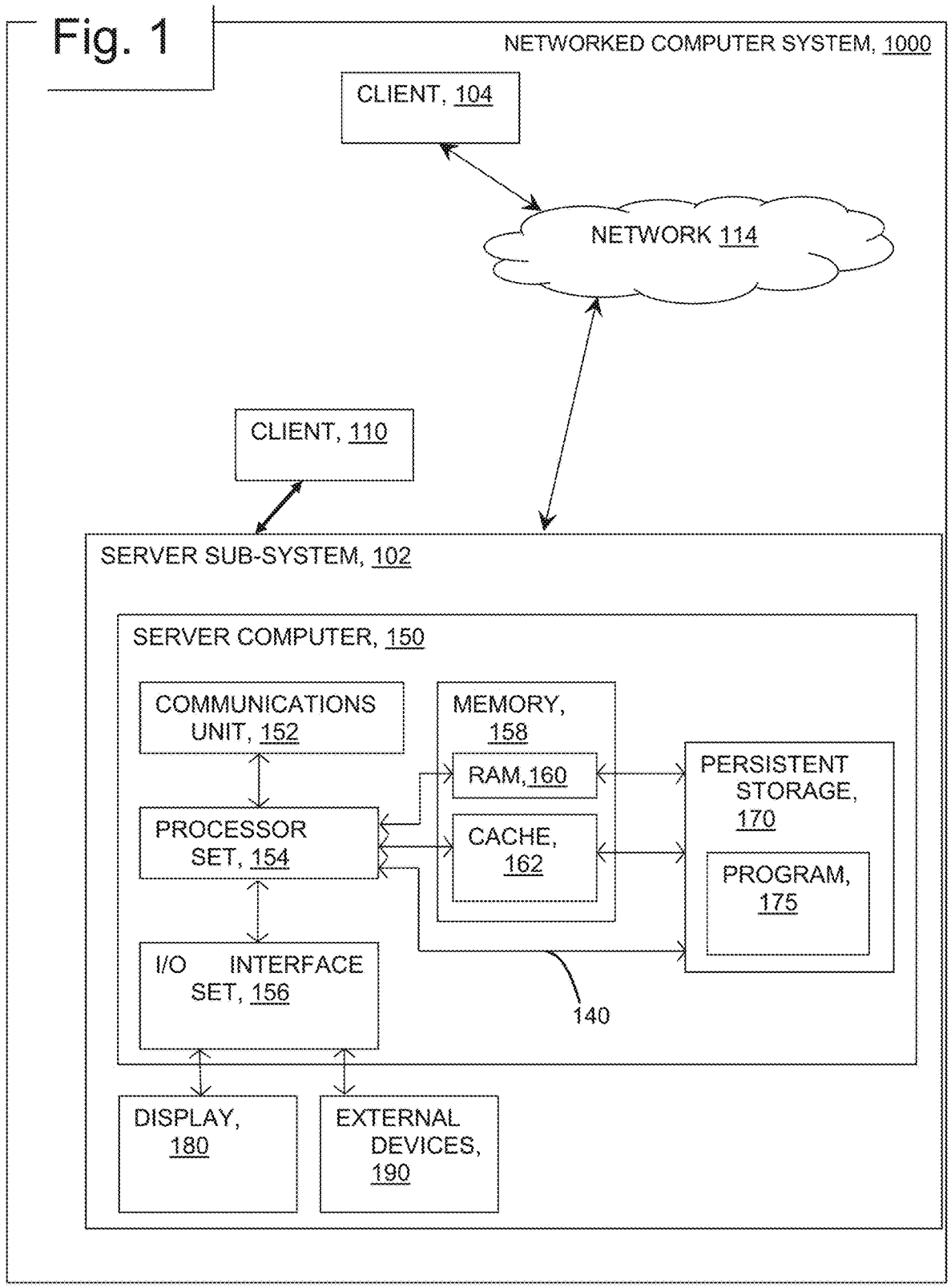
FIG. 1 provides a schematic illustration of system components, according to an embodiment of the invention.

The use of a cloud brokerage service as a single source for cloud computing resources provides an efficiency by eliminating time spent finding a resource provider. At the same time, a single-source provider may not offer the most up to date technology and may not provide the best service in each situation. Applications may not be monolithic in terms of computing resource needs and those needs may also vary for each user application. The use of a single source provider, without regard to the nature of the actual computational needs of different applications, may result in situations where the user is overpaying for resources and not using resources most efficiently. A method to evaluate resource providers which also considers the granular needs of user applications is needed.

A computer implemented method, system, and program product provides for application decomposition and migration. Decomposition refers to analyzing an application and identifying components and sub-components of the application according to computational resources needed and the availability of cloud computing technologies. The components and sub-components may have distinct computational resource requirements. As an example, middleware sub-components may have different resource needs than database sub-components.

After decomposition, components and sub-components may be analyzed according to necessary computational resources and matched to CSP offerings matching the necessary resources with offered resources. Different deployment scenarios may be simulated to evaluate and rank deployment options and determine an optimal deployment scheme. An improvement in overall system resource utilization and performance may be achieved by migrating components and sub-components to CSPs offering resources most closely matched with the necessary resources according to the optimal scheme.

In an embodiment, the method includes receiving the details of a candidate application. The candidate application details may be received from the user, or from a designated CBS, or CSP. The details may include the number of VMs deployed for the application as well as the configuration details of the VMs. This information provides the basis for decomposing the application and defining the granularity of components and subcomponents of the application in terms of computational task, and computational resources, including VM usage, and the potential for allocating components and sub-components according to VM and computational task needs.

In an embodiment, CSP offerings are evaluated using machine learning constituents trained to evaluate CSP marketing and product specification materials to extract details associated with cloud computing services and products in terms of the underlying technologies. The constituents map the CSP offerings and technologies to the database, verify new CSP offerings by comparing mapping results to the database, and collect estimated costs from the CSP sites. The constituents extract the details of the technologies underlying each offered service and the associated costs of the services. In this embodiment, the extracted details are mapped to a technology offering database. The offered services and technologies are translated and normalized by a method algorithm to enable similar offerings to be compared and to enable application components to be associated with suitable offerings.

The technology categories defined in the technology offering database, after extraction by the machine learning, define the level of granularity against which components and sub-components may be mapped. Granularity may be defined in terms of available technology offerings. The CSP analyzer periodically, or continuously monitors the offerings of existing CSPs and searches for new CSPs for analysis. In this manner, the technology offering database remains current with regard to itemized technologies per service available from the respective CSPs, together with the costs associated with the service offerings. The technology offering database includes the possible characteristics by which a particular technology may be defined, and which may then be used to subdivide application components for distributed processing allocation according to necessary technology.

In an embodiment, component granularity may be defined according to application transactions, database interactions, service functions, containers, storage aspects, and combinations of these items. External application dependency tools identify interactions and connections between components.

Once components are identified for each VM used by an application, further analysis of the components, in terms of computational activity and utilized resources, identifies subcomponents which may be deployed across multiple VMs and therefore multiple CSPs. Payment records associated with past use of the application provide an indication of the nature of the tasks used by the application and the associated technology needed for the application. This information may be used in conjunction with the technology offering database to map application components and defined granular subcomponents to CSP current service offerings.

In an embodiment, a database server may contain many instances with many databases and each one may have a different behavior (high intensive queries, high load database, high intensive database memory used, high intensive i/o etc.), and each instance and each varying type of database may be deployed to a separate VM and CSP.

Database tasks have different needs from middleware processing tasks, web based tasks, or components which primarily execute function calls. Even among the task types there may be resource variations. Database tasks may benefit from different resource allocations depending upon the database deployment details. Databases may be deployed in many ways such as having a database with high intensive queries, another with high load, another with high intensive memory usage, another with high intensive I/O (input/output). Each of these respective deployment configurations may benefit from a tailored resource allocation optimized according to the particular configuration and associated computing tasks. Each may be deployed to a VM tailored to support the specific task and to a CSP offering tailored services for that task.

In an embodiment, deployment of the components and sub-components of the application across different CSP service and product offerings may be simulated to evaluate cost differences associated with each deployment scenario. A plurality of simulations may be generated varying in terms of the details of component and sub-component deployment to differing CSPs. The respective simulations may include consideration for service cost as well as service suitability in terms of matching the specific service technology to the component and sub-component needs. In an embodiment, a score associated with the degree of matching between service technology and component needs may be calculated and provided in addition to the estimated cost of the scenario. The scenarios may be ranked according to the matching score or other scenario parameters.

In an embodiment, performance information associated with the respective CSP service and product offerings may be collected from internet sources, including the CSP sites, in terms of user feedback as well as objective performance evaluations of the respective services and stored in the technology offering database or a separate performance mapping database. In this embodiment, the performance information may be included in an analysis of the scenarios in addition to the service cost of the scenario and any scoring associated with technology matching.

In an embodiment, the scenario simulations yield a set of scores for different deployments in terms of cost, performance rating and technology matching. This set may then be utilized as the basis for a ranking of the respective scenarios depending upon the aspects of the analysis which the user chooses to optimize against. Cost alone may not drive the deployment decision as performance factors may indicate that the low cost deployment is associated with unacceptable performance issues.

In an embodiment, the user may relent deployment to an automated decision tree. In this embodiment, the user may specify thresholds and an order of precedence in terms of cost, performance and technologies and relent the actual deployment of the components and subcomponents to the system of the disclosure. In this embodiment, the ongoing analysis of offerings and costs may result in ongoing redeployment of components and sub-components to maintain an optimized state according to the user's specified thresholds and precedence selections.

EXAMPLES

In an example embodiment, a company provides a credit score to general users. Each user provides information such as name and identification (id), and the company's application consults a set of external sources, does some calculation, stores information in a database and returns back to the user his/her credit score.

The following steps will be executed by the method: The method will receive from the company, or cloud broker or any other IT system, the list of application servers/VMs to be analyzed. For this scenario, the application has 2 VMs: a web server and one database server. The method will access external applications such as the Tivoli Application Dependency Discovery Manager, or another configuration manager containing a list of components deployed on each VM and relationships with internal and external entities. In this embodiment, the web server connects to the database server (contains one instance with one database) and external sources to query customer data. The external sources may include hundreds of sources for each type of data required (Payment history, Amounts owed, Length of credit history and Credit mix in use). The database has only one instance with one database.

The method will analyze each type of component to understand how the technology of the component can be broken down in smaller pieces. In this embodiment, the web server has four major functions to collect external data, plus a calculation function and a database registration function. It also has a function to display simulation results to the general user. The method also identifies the technology used: In this embodiment, NODE.JS is used for web applications and ORACLE database is used. (Note: the term(s) "NODE.JS" and/or "ORACLE" may be subject to trademark rights in various jurisdictions throughout the world and are used here only in reference to the products or services properly denominated by the marks to the extent that such trademark rights may exist.)

For each identified function, the method will collect performance metric data by leveraging external performance tools or local tools. It will collect the number of executions, memory used, and time elapsed of each function categorized by each external source accessed for each function.

Based on all information collected, the method will use the component technology breakdown and an internal technology offering mapping database to determine what options are available for breaking this application into smaller pieces (functions) and to be able to run it as a distributed set of functions.

The method will then collect the costs from each CSP for each function and calculate how much different deployment scenarios across multiple CSPs would cost. The method will perform a simulation analysis to identify the best deployment option that can minimize the application deployment costs. The set of results of the analysis may be ranked using analysis parameters.

In addition to this cost analysis the method considers external feedback from CSPs, social media, internet, cloud reviews and cloud analysts about how the different CSP Cloud function capabilities are seen by the market in terms of capability performance. This information will be taken into consideration for creating the summary to the user. The information may be linked to service scenarios or linked generally to CSP offerings for review by the user when viewing the summary details. The ranked summary may be provided in a print form or through a user interface. The use of a computer user interface enables the presentation of linked information from the internet or internal network sources.

Storage scenario: This example embodiment describes how the method would work to provide a ranked summary showing options for Storage components for a customer that provides its current application name.

In this embodiment, the customer will request an advisory ranked summary for application xyz. The method will receive from cloud brokerage services all components billed to the customer for application xyz. The method will break down xyz according to the billed components and analyze in the technology offering database all offerings available for each component. For Storage components the method will provide: the amount of data stored per tier (hot, cold, archive) along with reads and writes over the last 3 months. The method will analyze data access frequency and identify the storage tier associated with it. The method will compare entries in the technology offering database to determine which offering could provide a better price for less frequently accessed data. The method will provide an advisory summary suggesting a change of storage service options from hot to cool tier for identified data and provide an estimated cost saving for this option. In an embodiment, the method will undertake to make the changes to the storage service options and storage service providers according to settings selected by the user.

In addition to this cost analysis, the analysis will take into consideration external feedback from social media, internet, cloud reviews and cloud analysts about how the performance of the available CSP cloud storage capabilities are seen by the market.

FIG. 1 provides a schematic illustration of network resources associated with practicing of the disclosed inventions. As shown in the figure, a networked Client device 110 connects wirelessly to a server subsystem 102. As shown in FIG. 1, server subsystem 102 comprises a server computer 150. FIG. 1 depicts a block diagram of components of server computer 150 within distributed data processing environment 1000 of FIG. 1, in accordance with an embodiment of the present invention. It should be appreciated that FIG. 1 provides only an illustration of one implementation and does not imply any limitations with regard to the environments in which different embodiments can be implemented. Many modifications to the depicted environment can be made.

Server computer 150 can include processor(s) 154, memory 158, persistent storage 170, communications unit 152, input/output (I/O) interface(s) 156 and communications fabric 140. Communications fabric 140 provides communications between memory 158, persistent storage 170, communications unit 152, and input/output (I/O) interface(s) 156. Communications fabric 140 can be implemented with any architecture designed for passing data and/or control information between processors (such as microprocessors, communications and network processors, etc.), system memory, peripheral devices, and any other hardware components within a system. For example, communications fabric 140 can be implemented with one or more buses.

Memory 158 and persistent storage 170 are computer readable storage media. In this embodiment, memory 158 includes random access memory (RAM) 160 and cache memory 162. In general, memory 158 can include any suitable volatile or non-volatile computer readable storage media. Cache 162 is a fast memory that enhances the performance of processor(s) 154 by holding recently accessed data, and data near recently accessed data, from other portions of memory 158.

Program instructions and data used to practice embodiments of the present invention, e.g., the application analysis, decomposition and migration program 175, are stored in persistent storage 170 for execution and/or access by one or more of the respective processor(s) 154 of server computer 150 via cache 162. In this embodiment, persistent storage 170 includes a magnetic hard disk drive. Alternatively, or in addition to a magnetic hard disk drive, persistent storage 170 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 170 may also be removable. For example, a removable hard drive may be used for persistent storage 170. Other examples include optical and magnetic disks, thumb drives, and smart cards that are inserted into a drive for transfer onto another computer readable storage medium that is also part of persistent storage 170.

Communications unit 152, in these examples, provides for communications with other data processing systems or devices, including resources of client computing devices 104 and 110. Client computing device 104 communicates with the elements of the networked computer system 1000 via network resources 114. In these examples, communications unit 152 includes one or more network interface cards. Communications unit 152 may provide communications through the use of either or both physical and wireless communications links. Software distribution programs, and other programs and data used for implementation of the present invention, may be downloaded to persistent storage 170 of server computer 150 through communications unit 152.

I/O interface(s) 156 allows for input and output of data with other devices that may be connected to server computer 150. For example, I/O interface(s) 156 may provide a connection to external device(s) 190 such as a keyboard, a keypad, a touch screen, a microphone, a digital camera, and/or some other suitable input device. External device(s) 190 can also include portable computer readable storage media such as, for example, thumb drives, portable optical or magnetic disks, and memory cards. Software and data used to practice embodiments of the present invention, e.g., application analysis, decomposition and migration program 175 on server computer 150, can be stored on such portable computer readable storage media and can be loaded onto persistent storage 170 via I/O interface(s) 156. I/O interface(s) 156 also connect to a display 180.

Display 180 provides a mechanism to display data to a user and may be, for example, a computer monitor. Display 180 can also function as a touch screen, such as a display of a tablet computer.

Figure 2:
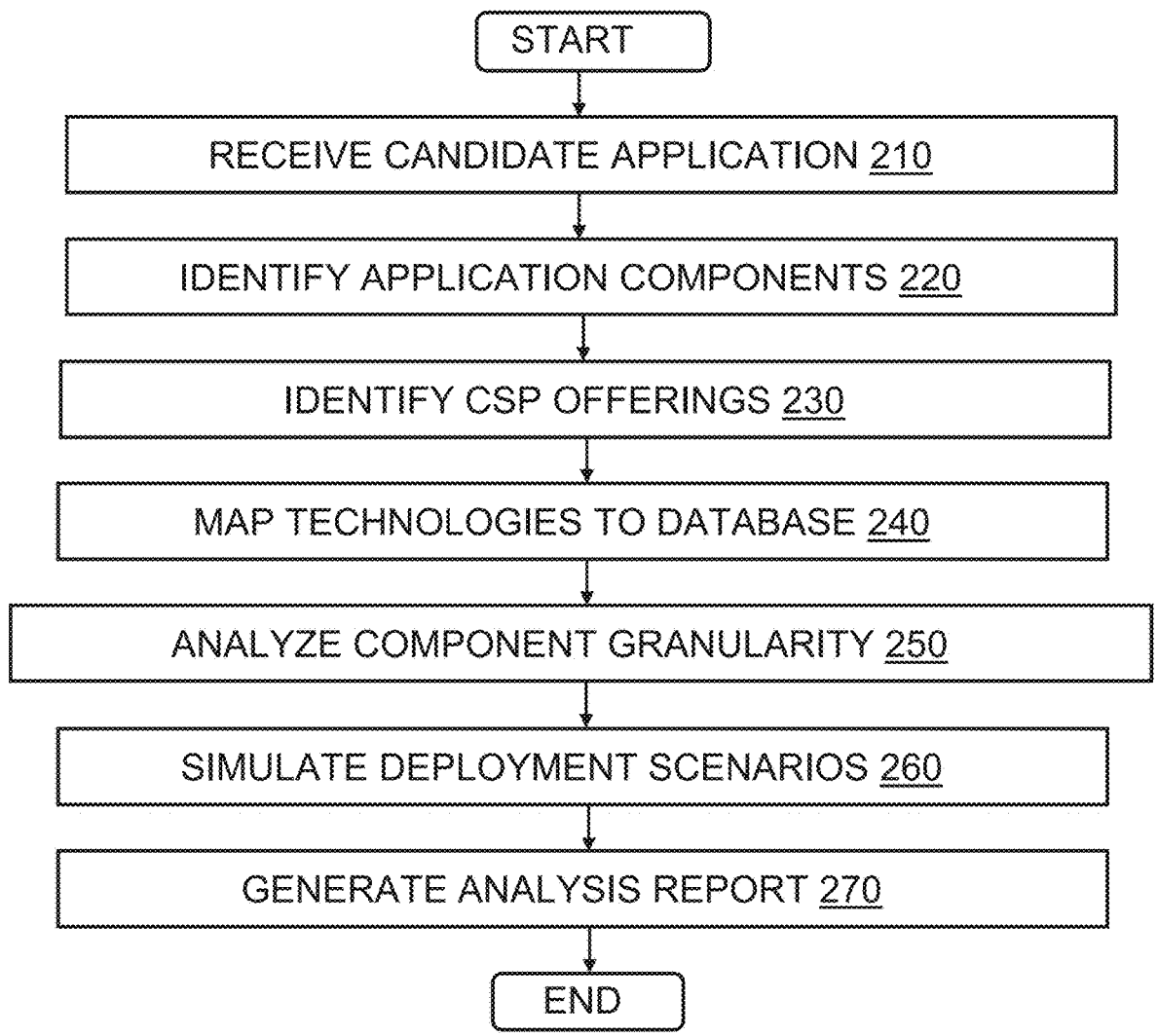
FIG. 2 provides a flowchart depicting the logical execution of steps, according to an embodiment of the invention.

Flowchart 200 of FIG. 2 depicts activities associated with an execution of an embodiment of the disclosed method. At 210, a candidate application is received. At 220, components of the candidate application are identified. At 230, cloud service provider offerings are identified. At 240, the technologies of the cloud service provider offerings are mapped to a technology offering database. At 250, component granularity and the possibility of dividing components into sub-components is analyzed. Cost and performance scenarios, where different sub-component deployments across multiple CSPs, are simulated at 260. A ranking of the results of the simulations of 260 is generated at 270. The ranking generated at 270 serves as a basis for the deployment of application sub-components across CSPs. Sub-components may be deployed across the service offerings of CSPs according to the comparisons of the simulations.

Figure 3:
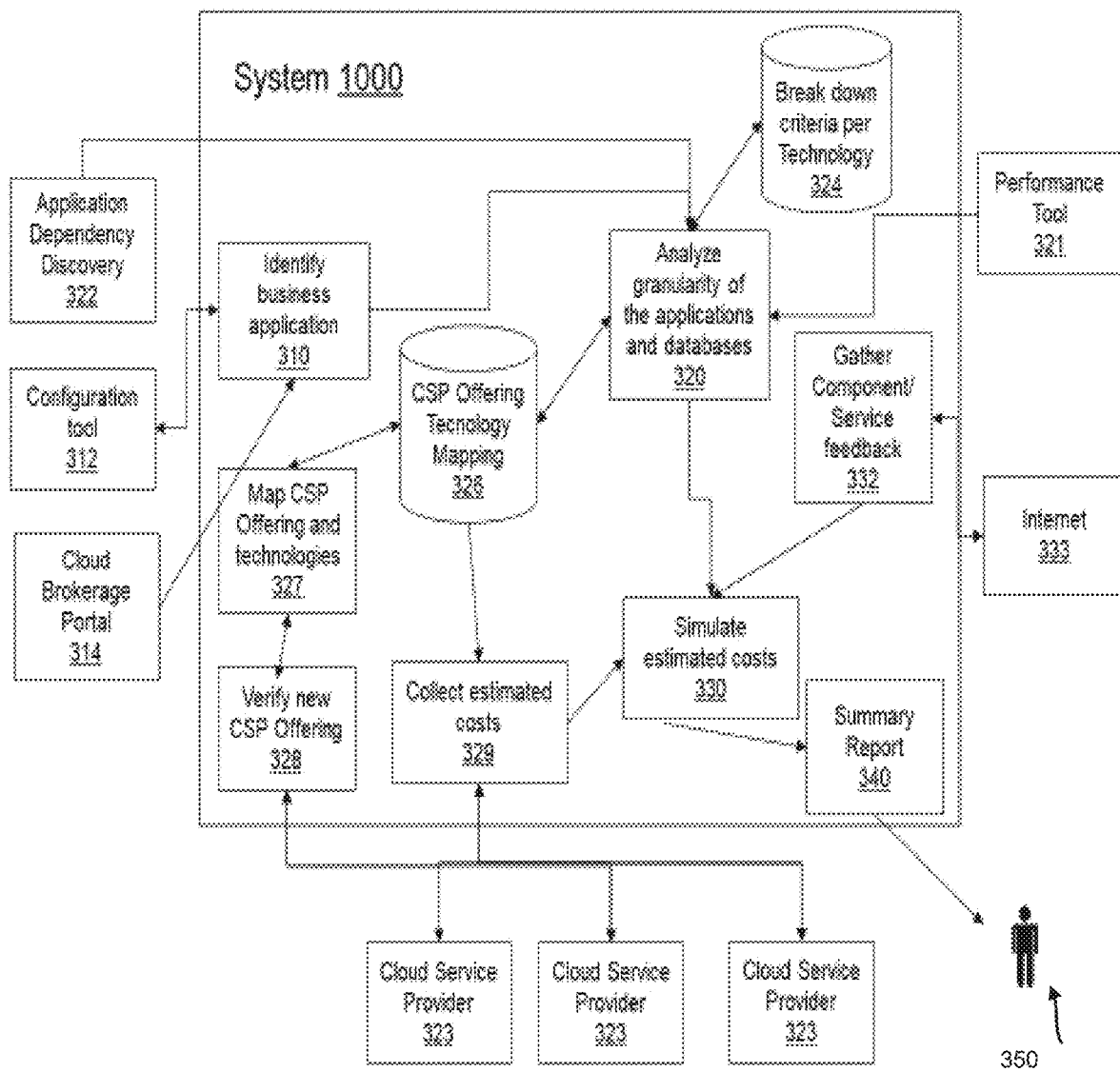
FIG. 3 depicts system architecture, according to an embodiment of the invention.

Referring to FIG. 3, system architecture 1000 supports an embodiment of the invention. As shown in the figure, module 310 identifies business applications, supported by configuration tool 312 to analyze the components of the applications and cloud brokerage portal 314 providing details regarding current cloud services used to support the applications. Current applications and databases are analyzed at 320 to determine the granularity of the applications and databases. External application dependency tools are used to determine dependencies between applications at 322. The criteria of the applications and databases are broken down according to the respective technology used at 324. Component and CSP performance data are provided by performance tool 321. CSP offerings are mapped to a database at 326 utilizing information from an initial map of CSP offerings and technologies 327 which have been verified at 328. Cost estimates associated with the CSP offerings 329 are also mapped to the database 326. Offerings are verified, and cost estimates are extracted from respective CSPs 323. Component service feedback related to respective CSP offerings in gather from the Internet 333 by module 332. The feedback estimated costs and application granularity information are used to simulate cost estimates for different application configuration scenarios wherein application components are deployed across CSPs to maximize performance and minimize costs at 330. The simulated scenarios are summarized and ranked in an output providing the details of cost and performance trade-offs associated with respective deployment scenarios for user 350 at 340. The user may then deploy the application components in accordance with the summary from 340.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
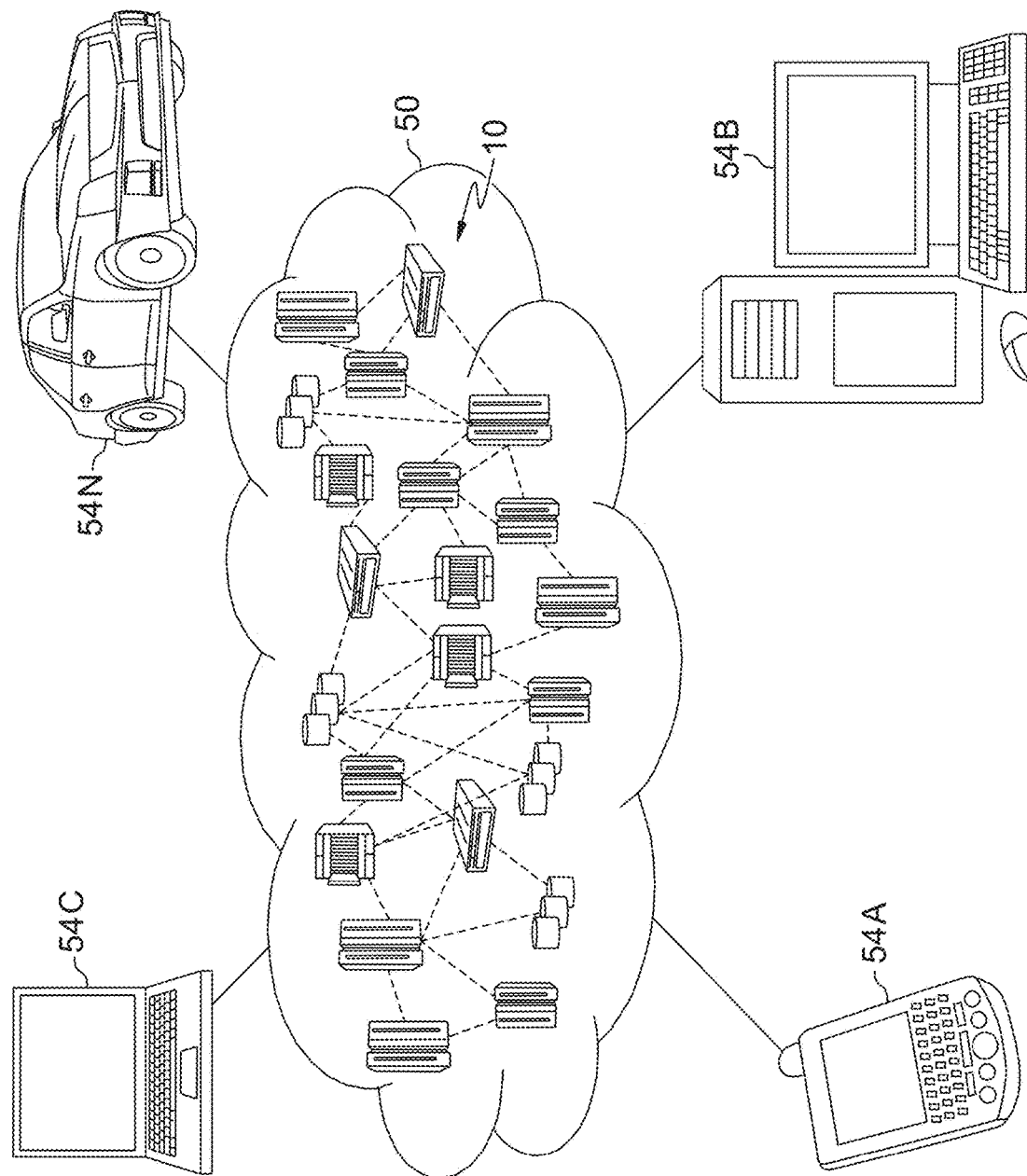
FIG. 4 depicts a cloud computing environment, according to an embodiment of the invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
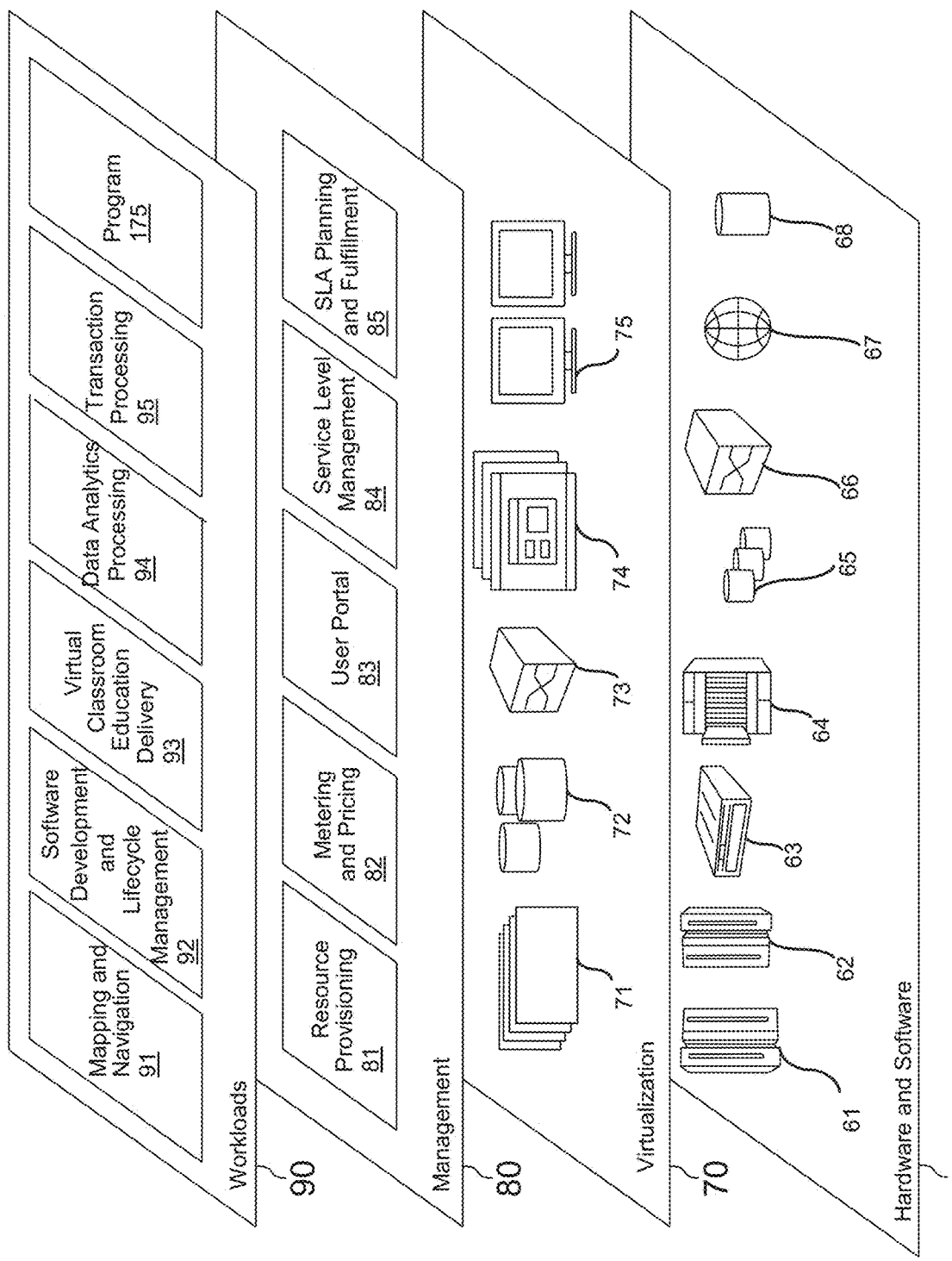
FIG. 5 depicts abstraction model layers, according to an embodiment of the invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and application analysis, decomposition and migration program 175.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer implemented method for cloud brokerage application decomposition and migration, the method comprising:
   receiving, by one or more computer processors, a candidate application;
   identifying, by the one or more computer processors, components of the candidate application;
   identifying, by the one or more computer processors, cloud service provider offerings;
   mapping, by the one or more computer processors, the cloud service provider offerings to technology categories of a technology offering database;
   analyzing, by the one or more computer processors, component granularity of one or more components according to the technology categories of the technology offering database;
   decomposing, by the one or more computer processors, a component into sub-components according to the component granularity;
   collecting, by the one or more computer processors, performance information on the cloud service provider offerings;
   generating, by the one or more computer processors, a plurality of simulated performance scenarios associated with deploying sub-components across the cloud service provider offerings;
   calculating, by the one or more computer processors, a score associated with a degree of matching between service provider offerings and sub-component needs;
   estimating, by the one or more computer processors, a cost associated with each simulated performance scenario of the plurality of simulated performance scenarios;
   ranking, by the one or more computer processors, the plurality of performance scenarios according to the performance information, the score, and the cost, yielding a ranked set of performance scenarios; and
   deploying, by the one or more computer processors, sub-components according to an automated decision tree and the ranked set of performance scenarios, wherein the automated decision tree is based on a user's specified thresholds and precedence selections.

2. The computer implemented method according to claim 1, wherein identifying components of the candidate application is based, at least in part, upon information associated with candidate application virtual machine usage.

3. The computer implemented method according to claim 1, wherein identifying cloud service provider offerings comprises identifying, by one or more computer processors, information selected from the group consisting of: changes in current available services, costs and changes in costs, availability of cloud service provider(s), and combinations thereof.

4. The computer implemented method according to claim 1, wherein analyzing component granularity is based, at least in part, upon information selected from the group consisting of: application transactions, database interactions, service functions, containers, storage aspects, and combinations thereof.

5. The computer implemented method according to claim 1, wherein decomposing a component into sub-components according to component granularity is based, at least in part, upon information in the technology offering database.

6. The computer implemented method according to claim 1, wherein generating a plurality of simulated performance scenarios associated with deploying sub-components across cloud service provider offerings is based, at least in part, upon cloud service provider information and cloud service provider user feedback.

7. A computer program product for application decomposition and migration, the computer program product comprising one or more computer readable storage media and program instructions stored on the one or more computer readable storage media, the program instructions comprising:
  programmed instructions for receiving a candidate application;
  programmed instructions for identifying components of the candidate application;
  programmed instructions for identifying cloud service provider offerings;
  programmed instructions for mapping the cloud service provider offerings to a technology offering database;
  programmed instructions for analyzing component granularity according to the technology categories of the technology offering database;
  programmed instructions for decomposing a component into sub-components according to component granularity;
  programmed instructions for collecting performance information on the cloud service provider offerings;
  programmed instructions for generating a plurality of simulated performance scenarios associated with deploying sub-components across the cloud service provider offerings;
  program instructions for calculating a score associated with the degree of matching between service provider offerings and sub-component needs;
  program instructions for estimating a cost associated with each simulated performance scenario of the plurality of simulated performance scenarios;
  programmed instructions for ranking the plurality of simulated performance scenarios according to the performance information, the score, and the cost, yielding a ranked set of performance scenarios; and
  deploying sub-components according to an automated decision tree and the ranked set of performance scenarios, wherein the automated decision tree is based on a user's specified thresholds and precedence selections.

8. The computer program product according to claim 7, wherein identifying components of the candidate application is based, at least in part, upon candidate application virtual machine usage.

9. The computer program product according to claim 7, wherein identifying cloud service provider offerings comprises identifying information selected from the group consisting of: changes in current available services, costs and changes in costs, availability of cloud service provider(s), and combinations thereof.

10. The computer program product according to claim 7, wherein analyzing component granularity is based, at least in part, upon information selected from the group consisting of: application transactions, database interactions, service functions, containers, storage aspects, and combinations thereof.

11. The computer program product according to claim 7, wherein decomposing a component into sub-components according to component granularity is based, at last in part, upon information in the technology offering database.

12. The computer program product according to claim 7, wherein generating a plurality of simulated performance scenarios associated with deploying sub-components across cloud service is based, at least in part, upon cloud service provider information and cloud service provider user feedback.

13. A computer system for application decomposition and migration, the computer system comprising:
  one or more computer processors;
  one or more computer readable storage devices;
  program instructions stored on the one or more computer readable storage devices for execution by the at least one computer processor, the program instructions comprising: programmed instructions for receiving a candidate application;
  programmed instructions for receiving a candidate application;
  programmed instructions for identifying components of the candidate application;
  programmed instructions for identifying cloud service provider offerings;
  programmed instructions for mapping the cloud service provider offerings to a technology offering database;
  programmed instructions for analyzing component granularity according to the technology categories of the technology offering database;
  programmed instructions for decomposing a component into sub-components according to component granularity;
  programmed instructions for collecting performance information on the cloud service provider offerings;
  programmed instructions for generating a plurality of simulated performance scenarios associated with deploying sub-components across the cloud service provider offerings;
  program instructions for calculating a score associated with the degree of matching between service provider offerings and sub-component needs;
  program instructions for estimating a cost associated with each simulated performance scenario of the plurality of simulated performance scenarios;
  programmed instructions for ranking the plurality of simulated performance scenarios according to the performance information, the score, and the cost, yielding a ranked set of performance scenarios; and
  deploying sub-components according to an automated decision tree and the ranked set of performance scenarios, wherein the automated decision tree is based on a user's specified thresholds and precedence selections.

14. The computer system according to claim 13, wherein identifying components of the candidate application is based, at least in part, upon information associated with candidate application virtual machine usage.

15. The computer system according to claim 13, wherein identifying cloud service provider offerings is based, at least in part, upon information selected from the group consisting of: changes in current available services, changes in costs, availability of cloud service provider(s), and combinations thereof.

16. The computer system according to claim 13, wherein analyzing component granularity is based, at least in part, upon information selected from the group consisting of: application transactions, database interactions, service functions, containers, storage aspects, and combinations thereof.

17. The computer system according to claim 13, wherein decomposing a component into sub-components according to component granularity is based, at least in part, upon information in the technology offering database.

* * * * *